United States Patent
Sohn et al.

(10) Patent No.: US 11,486,834 B2
(45) Date of Patent: Nov. 1, 2022

(54) SUBSTRATE INSPECTION METHOD AND METHOD OF FABRICATING A SEMICONDUCTOR DEVICE USING THE SAME

(71) Applicant: SAMSUNG ELECTRONICS CO., LTD., Suwon-si (KR)

(72) Inventors: Younghoon Sohn, Incheon (KR); Yusin Yang, Seoul (KR); Chihoon Lee, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 506 days.

(21) Appl. No.: 16/709,222

(22) Filed: Dec. 10, 2019

(65) Prior Publication Data

US 2020/0209165 A1 Jul. 2, 2020

(30) Foreign Application Priority Data

Dec. 27, 2018 (KR) .................... 10-2018-0170933
Oct. 10, 2019 (KR) .................... 10-2019-0125166

(51) Int. Cl.
*G01N 21/95* (2006.01)
*H01L 21/67* (2006.01)
*G01N 21/45* (2006.01)

(52) U.S. Cl.
CPC ......... *G01N 21/9505* (2013.01); *G01N 21/45* (2013.01); *H01L 21/67288* (2013.01)

(58) Field of Classification Search
CPC .............. G01N 21/45; G01N 21/9505; G01N 2021/1708; G01N 21/17; G01N 21/8422; G01N 21/8851; G01N 2291/015; G01N 2291/02818; G01N 2291/02827; G01N 2291/0425; G01N 29/04; G01N 29/043; G01N 29/11; G01N 29/225; G01N 29/2418; G01N 29/27; H01L 21/67288
USPC ........................................................ 438/16
See application file for complete search history.

(56) References Cited

U.S. PATENT DOCUMENTS

| | | | |
|---|---|---|---|
| 7,197,426 B2 | 3/2007 | Park et al. | |
| 7,526,959 B2 * | 5/2009 | Kim ................... | G01N 29/043 73/598 |
| 9,041,931 B2 | 5/2015 | Colgan et al. | |
| 9,453,820 B2 | 9/2016 | Masada | |
| 9,991,176 B2 | 6/2018 | Mehendale et al. | |
| 10,008,424 B2 | 6/2018 | Wimplinger | |

FOREIGN PATENT DOCUMENTS

| | | |
|---|---|---|
| JP | 2004-335570 A | 11/2004 |
| KR | 10-2010-0058174 A | 6/2010 |

* cited by examiner

*Primary Examiner* — Tri T Ton
(74) *Attorney, Agent, or Firm* — Lee IP Law, P.C.

(57) ABSTRACT

Disclosed are a substrate inspection method and a method of fabricating a semiconductor device using the same. The inspection method may include measuring a target area of a substrate using a pulsed beam to obtain a first peak, measuring a near field ultrasound, which is produced by the pulsed beam in a near field region including the target area, using a first continuous wave beam different from the pulsed beam to obtain a second peak, and measuring a far field ultrasound, which is produced by the near field ultrasound in a far field region outside the near field region, using a second continuous wave beam to examine material characteristics of the substrate.

20 Claims, 20 Drawing Sheets

SUBSTRATE INSPECTION METHOD AND METHOD OF FABRICATING A SEMICONDUCTOR DEVICE USING THE SAME

CROSS-REFERENCE TO RELATED APPLICATIONS

This U.S. non-provisional patent application claims priority under 35 U.S.C. § 119 to Korean Patent Application Nos. 10-2018-0170933 and 10-2019-0125166, filed on Dec. 27, 2018 and Oct. 10, 2019, respectively, in the Korean Intellectual Property Office, the entire contents of which are hereby incorporated by reference.

BACKGROUND

1. Field

The present disclosure relates to a method of inspecting a substrate and a method of fabricating a semiconductor device using the same, and in particular, to a method of inspecting a substrate in optical and photoacoustic manners and a method of fabricating a semiconductor device using the inspection method.

2. Description of the Related Art

As fineness and complexity of a semiconductor process increase, it is necessary to detect defects in a semiconductor device. By detecting the defects on or in a semiconductor device, it is possible to improve reliability and process yield of the semiconductor device. For example, the defects on or in the semiconductor substrate may be detected by an optical method.

SUMMARY

An embodiment provides an inspection method, which can obtain information on defects and material characteristics of substrate, and a method of fabricating a semiconductor device using the inspection method.

According to an embodiment, a substrate inspection method may include measuring a target area of a substrate using a pulsed beam to obtain a first peak containing information on a surface defect of the substrate, measuring a near field ultrasound, which is produced by the pulsed beam in a near field region including the target area, using a first continuous wave beam different from the pulsed beam to obtain a second peak containing information on an internal defect in the substrate or the surface defect, and measuring a far field ultrasound, which is produced by the near field ultrasound in a far field region outside the near field region, using a second continuous wave beam to examine material characteristics of the substrate.

According to an embodiment, a substrate inspection method may include measuring a target area on a substrate using a pulsed beam to obtain a first peak, measuring a near field ultrasound, which is produced by the pulsed beam in a near field region including the target area, using a first continuous wave beam different from the pulsed beam to obtain a second peak, and determining a kind of a defect, which is formed on the substrate, using the first peak and the second peak. The determining of the kind of the defect formed on the substrate using the first peak and the second peak may include determining whether there is the second peak, determining whether there is the first peak, when there may be the second peak, determining that a surface defect occurs in the target area, when there is the first peak, and determining that an internal defect occurs in the target area, when the first peak is absent.

According to an embodiment, a method of fabricating a semiconductor device may include performing a first processing process on a substrate and inspecting the substrate. The inspecting of the substrate may include measuring a target area of the substrate using a pulsed beam to obtain a first peak containing information on a surface defect of the substrate, and measuring a near field ultrasound, which is produced by the pulsed beam in a near field region including the target area, using a first continuous wave beam different from the pulsed beam to obtain a second peak containing information on an internal defect in the substrate or the surface defect.

BRIEF DESCRIPTION OF THE DRAWINGS

Features will become apparent to those of skill in the art by describing in detail exemplary embodiments with reference to the attached drawings, in which.

DETAILED DESCRIPTION

Example embodiments will now be described more fully with reference to the accompanying drawings, in which example embodiments are shown.

Figure 1A:
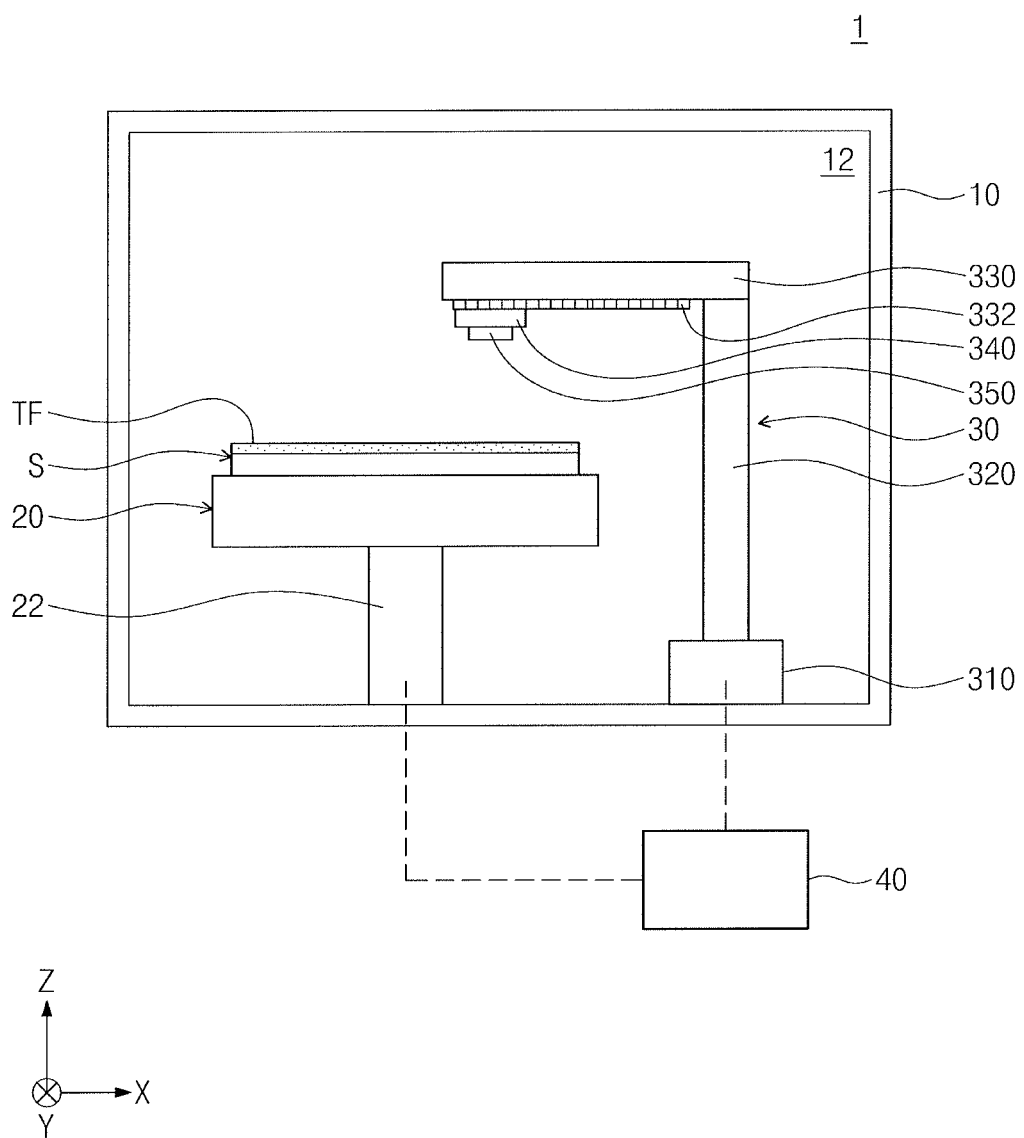
FIG. 1A illustrates a schematic diagram of a substrate inspection system according to an embodiment.

FIG. 1A is a schematic diagram illustrating a substrate inspection system 1 according to an embodiment.

Referring to FIG. 1A, the substrate inspection system 1 may include a process chamber 10, a stage 20, an optical inspection apparatus 30, and a controller 40. The substrate inspection system 1 may include the process chamber 10 with an internal space 12. The stage 20 and the optical inspection apparatus 30 may be disposed in the internal space 12 of the chamber 10.

Figure 1B:
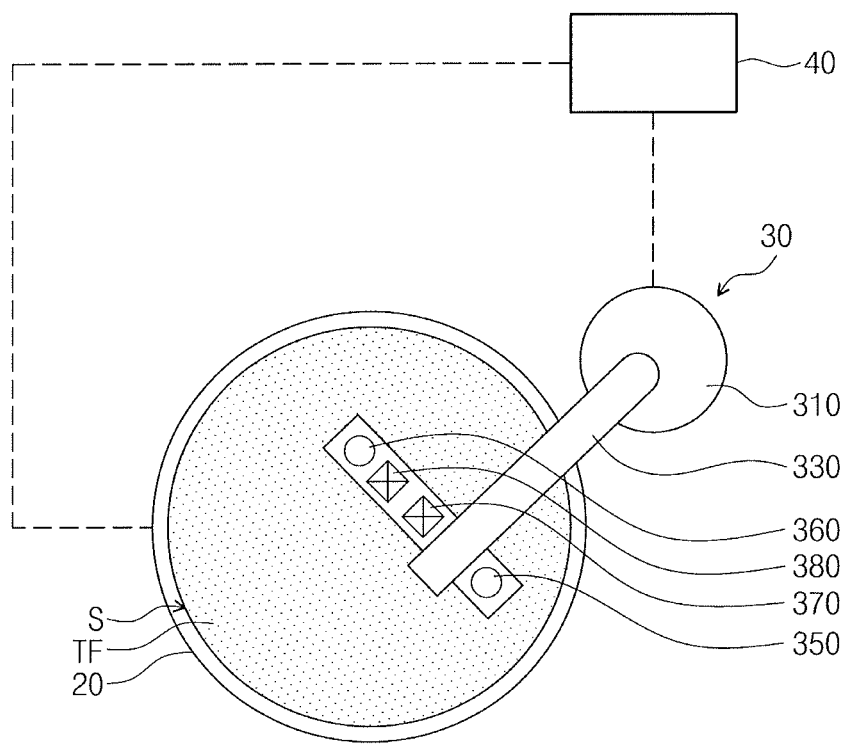
FIG. 1B illustrates a top view of a stage and an optical inspection apparatus.

FIG. 1B is a top view of the stage 20 and the optical inspection apparatus 30.

Referring to FIGS. 1A and 1B, a substrate S may be placed on a top surface of the stage 20. The substrate S may be fastened on the stage 20 by an electrostatic force or a vacuum pressure. The stage 20 may be configured to be rotated by a fixed axis 22.

The optical inspection apparatus 30 may be configured to perform an optical inspection process of providing light on a target object and measuring light reflected from the target object. Hereinafter, the substrate S will be described as an example of the target object, but embodiments are not limited to this example. For example, any object, which can be measured by the optical inspection process, may be selected as the target object.

The optical inspection apparatus 30 may be configured to perform an inspection process on the substrate S. For example, the optical inspection apparatus 30 may be configured to irradiate the substrate S with light and to measure light reflected from the substrate S. Optical characteristics of the reflected light may be analyzed by the optical inspection apparatus 30 or the controller 40 to obtain various information on the substrate S (e.g., on whether there is a defect on a thin film TF of the substrate S). In the present specification, the substrate S will refer to a semiconductor wafer for fabricating a semiconductor device or a glass substrate for fabricating a display device, but embodiments are not limited to this example. In the present specification, the substrate S may refer to a substrate structure, on which the thin film TF is formed. For example, the thin film TF may be provided as an upper part of the substrate S.

Referring to FIG. 1A, the optical inspection apparatus 30 may include a driver 310, a supporting axis 320, a supporting arm 330, and a body 340. The optical inspection apparatus 30 may be disposed in the internal space 12. The optical inspection apparatus 30 may be disposed at a side of the stage 20.

The driver 310 may be configured to move the body 340 in a vertical direction (e.g., Z direction). For example, the driver 310 may be used to adjust a vertical position of the body 340 or a distance between the body 340 and the substrate S. The driver 310 may be connected to a first end of the supporting axis 320.

A second end of the supporting axis 320 may be connected to a first end of the supporting arm 330 at a right angle, e.g., the first and second ends of the supporting axis 320 may be opposite ends along the Z direction. A second end of the supporting arm 330 may be connected to the body 340. For example, as illustrated in FIGS. 1A and 1B, the supporting arm 330 may have a longitudinal direction along the X direction, with the first and second ends of the supporting arm 330 on a same surface at opposite ends along the X direction.

A rail 332 may be disposed between the supporting arm 330 and the body 340.

The rail 332 may be disposed on a bottom surface of the supporting arm 330, i.e., on a surface of the supporting arm 330 facing the stage 20, to extend in a length direction (e.g., X direction) of the supporting arm 330, e.g., the rail 332 may have a longitudinal direction along the X direction to extend from the second end of the supporting arm 330 toward the first end of the supporting arm 330 to cover a majority (e.g., more than a half) of a length of the supporting arm 330 in the X direction.

The body 340 may be coupled to the supporting arm 330 at a right angle. For example, as illustrated in FIG. 1B, the body 340 may have a longitudinal direction extending in the Y direction and overlapping the stage 20, e.g., so the body 340 and the supporting arm 330 may be perpendicular to each other in a top view. The body 340 may be configured to be movable along the rail 332 and in a specific direction (e.g., the X direction), e.g., an edge of the body 340 coupled to the supporting aim 330 may be moveable along the supporting arm 330 via the rail 332. The body 340 may be moved along the rail 332 and in a radius direction of the substrate S, e.g., via rotation of the driver 310.

Figure 1C:
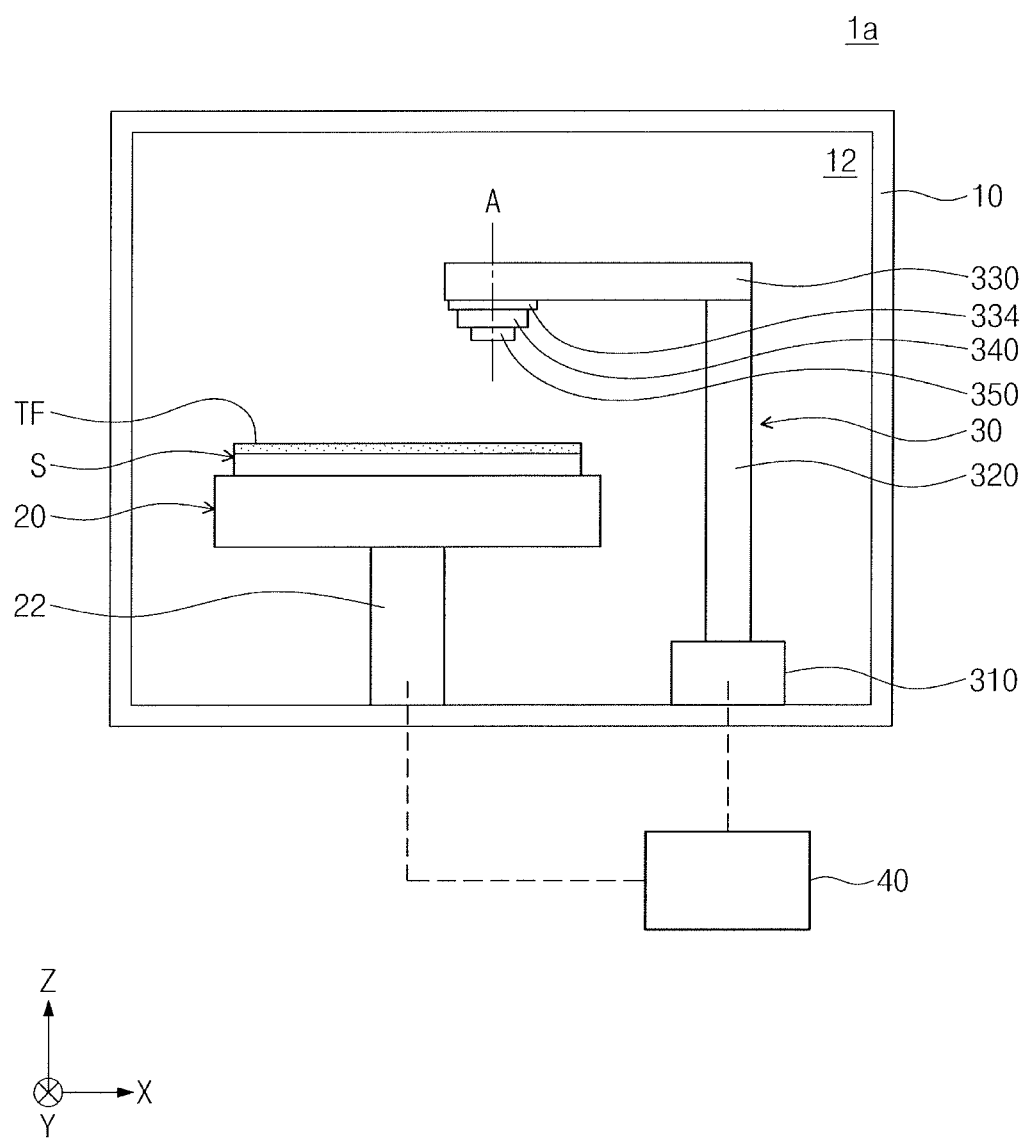
FIG. 1C illustrates a schematic diagram of a substrate inspection system according to an embodiment.

FIG. 1C is a schematic diagram illustrating a substrate inspection system 1a according to an embodiment.

Referring to FIG. 1C, a rotary part 334 may be disposed between the supporting arm 330 and the body 340, e.g., the body 340 may be coupled to the supporting arm 330 via the rotary part 334. The rotary part 334 may be disposed on the bottom surface of the second end of the supporting arm 330. The rotary part 334 allows the body 340 to be rotatable about an axis A of the rotary part 334. For example, the optical inspection apparatus may include both of the rail 332 and the rotary part 334 between the body 340 and the supporting arm 330, e.g., the rail 332 may be positioned between the supporting arm 330 and the rotary part 334 to allow movement of the body 340 with the rotary part 334 along the rail 332.

Referring back to FIGS. 1A and 1B, a light source 350, a light-receiving part 360, a first interferometer 370, and a second interferometer 380 may be disposed on the body 340. For example, the light source 350, the light-receiving part 360, the first interferometer 370, and the second interferometer 380 may be disposed on the bottom surface of the body 340, e.g., to face the stage 20. The light source 350, the light-receiving part 360, the first interferometer 370, and the second interferometer 380 may be disposed over the substrate S and may face the substrate S. FIG. 1B illustrates an example, in which the light source 350 is disposed at a side of the body 340 with respect to the supporting arm 330 and the first and second interferometers 370 and 380 and the light-receiving part 360 are disposed at an opposite side of the body 340, but embodiments are not limited to this example.

Figure 2:
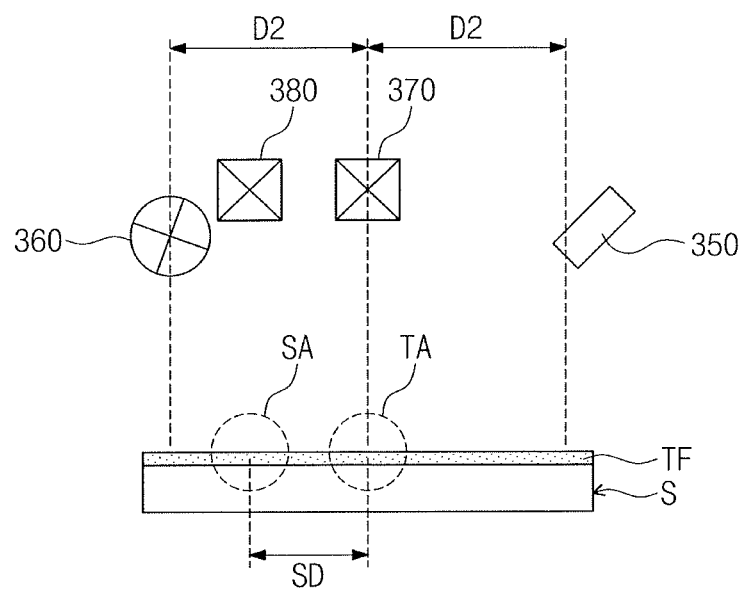
FIG. 2 illustrates a diagram of an arrangement of a light source, a light-receiving part, a first interferometer, and a second interferometer of FIG. 1B.

FIG. 2 is a diagram illustrating an arrangement of the light source 350, the light-receiving part 360, the first interferometer 370, and the second interferometer 380 of FIG. 1B. Hereinafter, the light source 350, the light-receiving part 360, the first interferometer 370, and the second interferometer 380 will be described in more detail with reference to FIGS. 1B and 2. The light source 350, the light-receiving part 360, the first interferometer 370, and the second interferometer 380 may be disposed at substantially the same height, but embodiments are not limited to this example. In particular, for convenience in illustration, they are illustrated to be disposed at different heights, but embodiments are not limited to this example.

The light source 350 may be disposed at a first end of the body 340. The light source 350 may be configured to provide an inspection light (e.g., see IL of FIG. 4A) onto a target area TA of the substrate S. The light source 350 may provide the inspection light IL onto the target area of the thin film TF. The thin film TF may expand instantly and generate an acoustic wave using the inspection light IL. As an example, the light source 350 may be a pulsed laser, but embodiments are not limited to this example.

The light-receiving part 360 may be disposed at a second, e.g., opposite, end of the body 340. The light-receiving part 360 may be configured to receive a reflection light (e.g., see RL of FIG. 4A) reflected from the target area TA of the substrate S. As an example, the light-receiving part 360 may be a photo diode detector (PDD), but embodiments are not limited to this example.

The first interferometer 370 may be disposed between the light source 350 and the light-receiving part 360. The first interferometer 370 may be disposed over the target area TA. A first distance D1 between the first interferometer 370 and the light source 350 may be substantially equal to a second distance D2 between the first interferometer 370 and the light-receiving part 360. In the present specification, the first distance D1 between the first interferometer 370 and the light source 350 may be a distance between a point of the first interferometer 370, i.e., from which a first light (e.g., see L1 of FIG. 4B) is emitted, and a point of the light source 350, i.e., from which the inspection light IL is emitted. Similarly, the second distance D2 between the first interferometer 370 and the light-receiving part 360 may be a distance between the point of the first interferometer 370, i.e., from which the first light L1 is emitted, and a point of the light-receiving part 360, i.e., to which the reflection light RL is incident.

The first interferometer 370 may measure a first sound signal of the acoustic wave at the target area TA. The first sound signal may be, e.g., a near-field ultrasound. The first interferometer 370 may be configured to emit the first light L1 toward the target area TA, e.g., along a direction normal to the substrate S, to receive the first light L1 reflected from the target area TA, and to measure a phase difference and/or interference therebetween. The near sound field may mean a region within a specific distance from a generation point of an ultrasonic wave. The near sound field may mean a region, for which a direct correlation between a sound pressure and a distance cannot be established, due to interference.

The second interferometer 380 may be disposed between the light source 350 and the light-receiving part 360. The second interferometer 380 may be disposed between the first interferometer 370 and the light-receiving part 360 or between the first interferometer 370 and the light source 350. In the present specification, the second interferometer 380 is disposed between the first interferometer 370 and the light-receiving part 360, but embodiments are not limited to this example. For example, in an embodiment, the second interferometer 380 may be disposed outside the light source 350 or the light-receiving part 360 along a radius direction of the substrate S.

The second interferometer 380 may be disposed over a separation area SA horizontally spaced apart from the target area TA, e.g., the separation area SA may be horizontally spaced apart from the target area TA by a distance SD. The second interferometer 380 may measure a second sound signal of the acoustic wave at the separation area SA. In an embodiment, the separation area SA may be a region, which is horizontally spaced apart from the target area TA by a distance equal to or larger than a near-field length. The separation area SA may correspond to a far sound field. The far sound field means a region, which is separated from a generation point of an ultrasonic wave by a distance equal to or larger than the near-field length or is located beyond the near sound field. In the far sound field, a sound pressure may be monotonically damped with a distance.

The first sound signal may be a near-field ultrasound, which is generated at top and bottom surfaces of a thin film on the target area TA, and the second sound signal may be a guided wave, which is changed by the top and bottom surfaces of the thin film during the propagation of the first sound signal. The guided wave may include a lamb wave. In the present specification, the near-field length, which is used as a criterion for classifying the near- and far-fields, may mean a length corresponding to one wavelength of the generated sound wave (e.g., the first sound signal). In description, a near-field means a distance within a wavelength of the acoustic wave (for example, the first wave signal), and a far-field means a region except for the near-field.

The second interferometer 380 may measure the second sound signal at the separation area SA. The second sound signal may be, e.g., a guided wave. The guided wave may propagate along the thin film TF. The first interferometer 370 may be configured to emit a second light L2 toward the separation area SA, to receive the second light L2 reflected from the separation area SA, and to measure an interference phenomenon therebetween.

Referring back to FIGS. 1A and 1B, the controller 40 may control the stage 20 and the optical inspection apparatus 30. The controller 40 may control the optical inspection apparatus 30 such that the entire top surface of the substrate S can be scanned, e.g., examined, by the optical inspection apparatus 30. As an example, under the control of the controller 40, the stage 20 may be rotated to allow the optical inspection apparatus 30 to scan the entire top surface of the substrate S. As another example, under the control of the controller 40, the body 340 may be moved along the rail 332 or rotated by the rotary part 334 to allow the optical inspection apparatus 30 to scan the entire top surface of the substrate S. In an embodiment, the controller 40 may control the stage 20 and the optical inspection apparatus 30 such that both of the stage 20 and the optical inspection apparatus 30 are moved or rotated.

Figure 3:
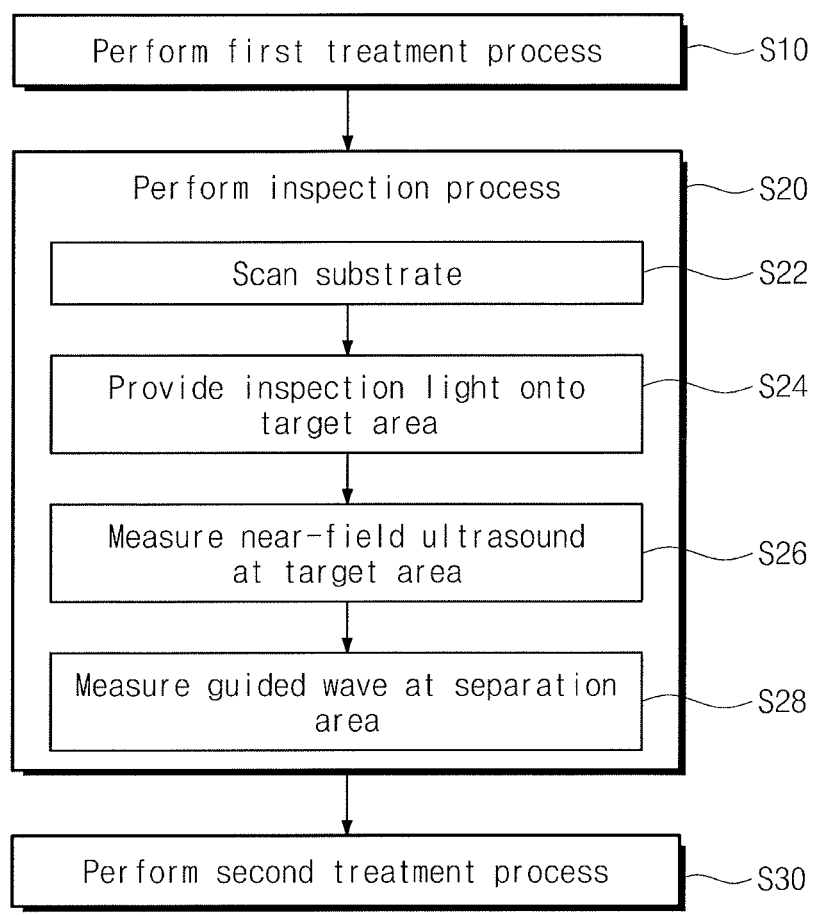
FIG. 3 illustrates a flow chart of a method of fabricating a semiconductor device, according to an embodiment.
Figure 4A:
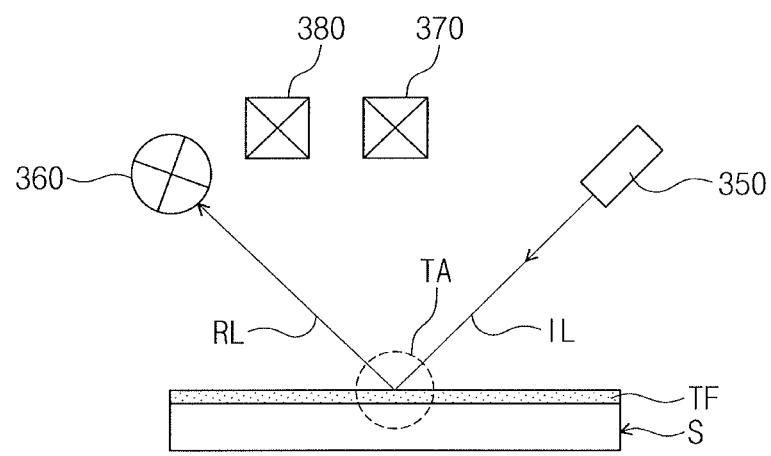
FIGS. 4A to 4C illustrate stages in the method of fabricating a semiconductor device, shown in FIG. 3.
Figure 4B:
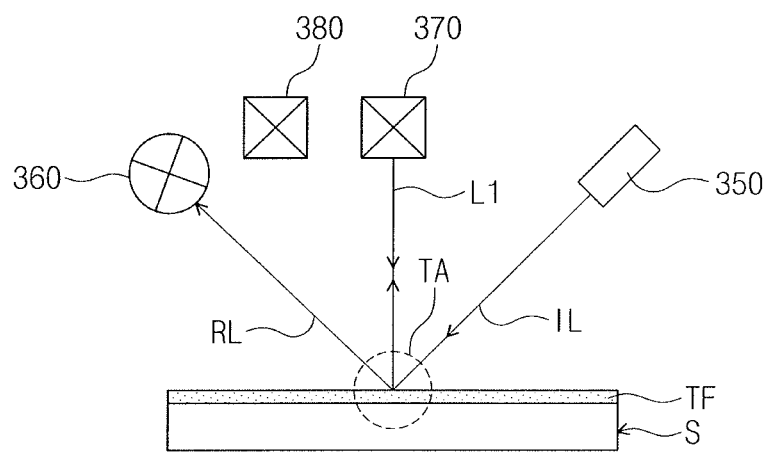
Figure 4C:
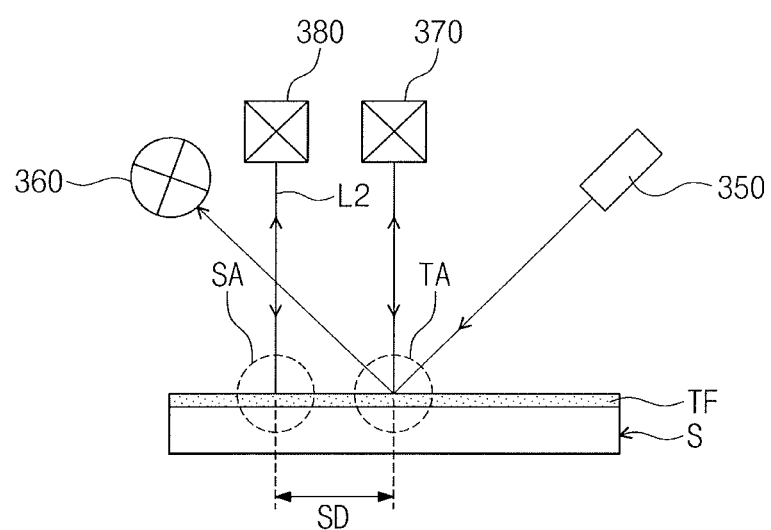

FIG. 3 is a flow chart illustrating a method of fabricating a semiconductor device, according to an embodiment. FIGS. 4A to 4C are diagrams sequentially illustrating stages in the method of FIG. 3. Hereinafter, a method of fabricating a semiconductor device, according to an embodiment, will be described with reference to FIGS. 3, 4A, 4B, and 4C.

First, a first treatment process may be performed on the substrate S (S10). The first treatment process may be, e.g., a thin film deposition process that includes forming the thin film TF on the substrate S, but embodiments are not limited to this example.

Next, an inspection process may be performed on the substrate S (S20), after the first treatment process. The substrate S, which is a target object of the inspection process, and on which the first treatment process has been performed, may include the thin film TF as an upper portion thereof The inspection process may be performed using the optical inspection apparatus 30. Next, a second treatment process (e.g., a patterning process, an etching, a cleaning process, etc.) may be performed (S30).

Referring to FIG. 3, the controller 40 may control the optical inspection apparatus 30 such that the substrate S is scanned, e.g., examined, by the optical inspection apparatus 30 (S22). The optical inspection apparatus 30 may scan the entire top surface of the substrate S, e.g., the optical inspection apparatus 30 may rotate the body 340 over the entire top surface of the substrate S. As an example, the controller 40 may rotate the stage 20 during the scanning of the substrate S. In addition, the controller 40 may move and/or rotate the optical inspection apparatus 30 during the scanning of the substrate S. In an embodiment, during the scanning of the substrate S, the stage 20 may be rotated and the optical inspection apparatus 30 may be moved and/or rotated under the control of the controller 40.

Referring to FIGS. 3 and 4A, the light source 350 may provide the inspection light IL onto the target area TA of the substrate S (in S24). As an example, the light source 350 may be a pulsed laser, but embodiments are not limited to this example. The light-receiving part 360 may receive the reflection light RL reflected from the target area TA of the substrate S. As an example, the light-receiving part 360 may be a photo diode detector (PDD), but embodiments are not limited to this example. The light-receiving part 360 may measure a light amount of the reflection light RL.

Referring to FIGS. 3 and 4B, the first interferometer 370 may measure a near-field ultrasound (in S26). The first interferometer 370 may be disposed over the target area TA. The first interferometer 370 may be configured to emit the first light L1 toward the target area TA, to receive the first light L1 reflected from the target area TA, and to measure an interference therebetween. The first interferometer 370 may measure a frequency and/or an amplitude of the near-field ultrasound at the target area TA.

Referring to FIGS. 3 and 4C, the second interferometer 380 may measure a far-field ultrasound (in S28). As an example, the second interferometer 380 may measure a guided wave. The guided wave may propagate along the thin film TF. The second interferometer 380 may be disposed over a separation area SA horizontally spaced apart from the target area TA. In an embodiment, the separation area SA may be a region, which is horizontally spaced apart from the target area TA by a distance equal to or larger than a near-field length. The second interferometer 380 may measure a frequency and a velocity of the guided wave at the separation area SA.

Providing the inspection light IL onto the target area TA (in S24), measuring the near-field ultrasound at the target area TA (in S26), and measuring the guided wave at the separation area SA (in S28) may be performed concurrently, e.g., simultaneously, with the scanning of the substrate S (in S22). That is, while scanning the substrate S, e.g., while moving the body 340 over the entire top surface of the substrate S, the inspection light IL may be provided onto the target area TA, the near-field ultrasound at the target area TA may be measured, and the guided wave at the separation area SA may be measured. As such, while the body 340 of the optical inspection apparatus 30 moves over the entire top surface of the substrate S, the entire top surface of the substrate S is inspected for defects via the measured reflected light, near-field ultrasound, and guided waves.

The target area TA may be changed by scanning the substrate S. As an example, by scanning the entire top surface of the substrate S, the entire top surface of the substrate S may become the target area TA. Owing to the change of the target area TA, the optical inspection apparatus 30 may collect information on a relative change of data obtained from the first interferometer 370, the second interferometer 380, and the light-receiving part 360.

The controller 40 may measure a change in the near-field ultrasound using the first interferometer 370. The measuring of the change of the near-field ultrasound may include measuring a change in frequency and/or amplitude of the near-field ultrasound. Based on the measured change of the near-field ultrasound, the controller 40 may determine whether there is a defect below or in the thin film TF of the substrate S.

Figure 5A:
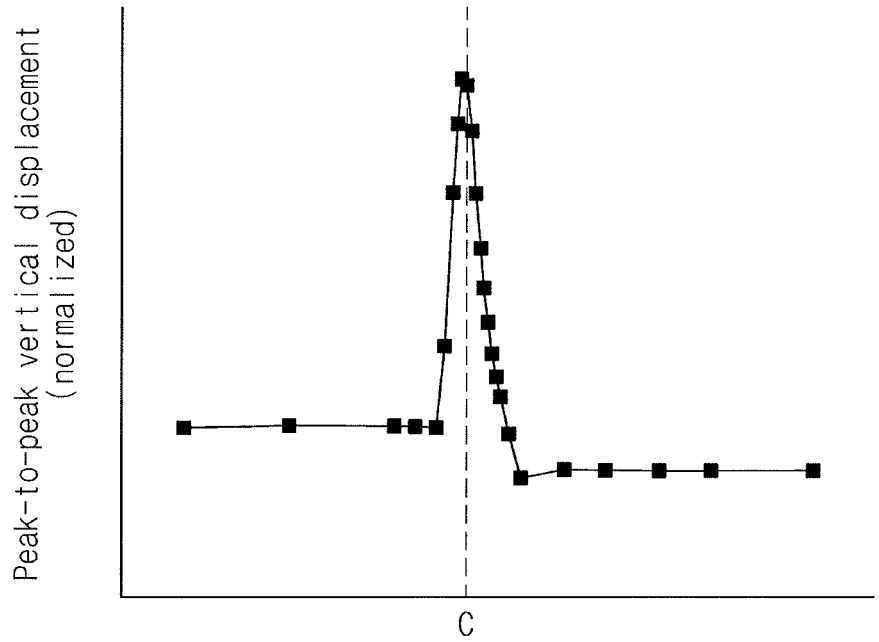
FIG. 5A illustrates a graph showing a change in amplitude of a near-field ultrasound, when there is a defect below a thin film of a substrate.
Figure 5B:
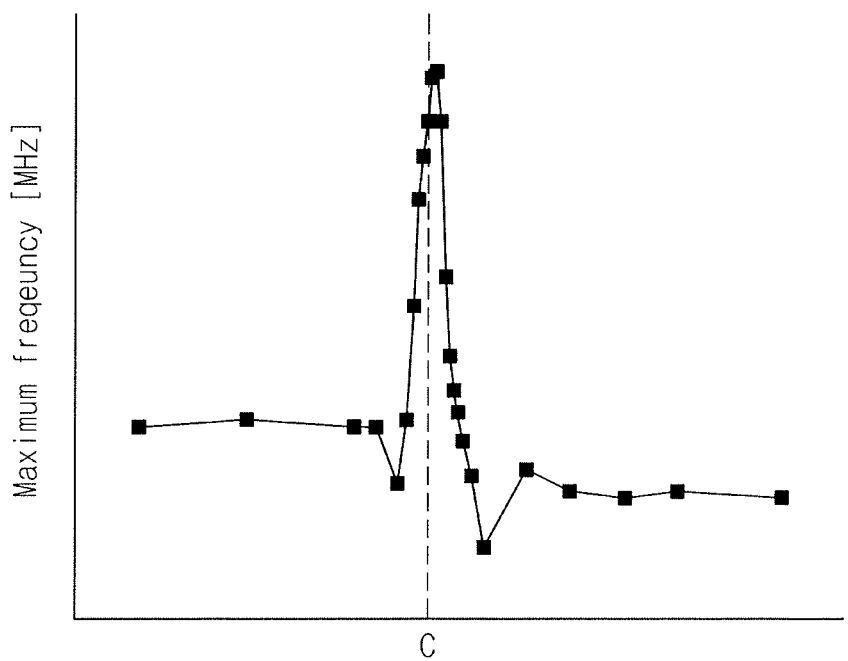
FIG. 5B illustrates a graph showing a change in frequency of a near-field ultrasound, when there is a defect below a thin film of a substrate.

FIG. 5A is a graph showing a change in amplitude of a near-field ultrasound, when there is a defect below the thin film TF of the substrate S. FIG. 5B is a graph showing a change in frequency of a near-field ultrasound, when there is a defect below the thin film TF of the substrate S. The horizontal axes in FIGS. 5A and 5B reflect horizontal positions along the substrate S. FIG. 5A shows that an amplitude of an ultrasonic wave was greatly changed, e.g., increased, when there was a defect C below the thin film TF of the substrate S. FIG. 5B shows that a frequency of an ultrasonic wave was greatly changed, e.g., increased, when there was the defect C below the thin film TF of the substrate S. A target area with the defect C may differ from a defect-free target area in terms of a modulus of elasticity caused by thermal expansion, and this may lead to a change in amplitude and/or frequency of the target area having the defect C.

The controller 40 may measure a change of the far-field ultrasound using the second interferometer 380. The measuring of the change of the far-field ultrasound may include measuring a change in frequency of the far-field ultrasound (e.g., guided wave). Based on the measured change of the far-field ultrasound, the controller 40 may obtain information on physical properties (e.g., a density, a modulus of elasticity, and so forth) of the substrate S.

The controller 40 may measure a change of the reflection light RL using the light-receiving part 360. The measuring of the change of the reflection light RL may include measuring a change in light amount of the reflection light RL. Based on the measured change of the reflection light RL, the controller 40 may examine whether there is a defect on a surface of the substrate S (e.g., a surface of the thin film TF).

Since the substrate S is scanned using the optical inspection apparatus 30, the entire top surface of the substrate S may be selected as a target area for the scanning process. In this case, the sound signals may be changed depending on the presence/absence or kind of a defect on the target area TA, and such a change in the sound signals may be measured by the optical inspection apparatus 30.

According to an embodiment, by inspecting the substrate S using the near-field ultrasound and the far-field ultrasound, it may be possible to examine whether there is a defect on the substrate S or to obtain information on physical properties of the thin film TF on the substrate S. In addition, by receiving a reflected light, it may be possible to determine whether the defect is located in or on the thin film TF, which is provided on the substrate S. When the substrate S is scanned using the optical inspection apparatus 30, the inspection process may be performed on the entire top surface of the substrate S.

As described above, the light-receiving part 360 may measure a light amount signal of the reflection light RL reflected from the target area TA, the first interferometer 370 may measure a near-field ultrasound signal at the target area TA, and the second interferometer 380 may measure a guided wave signal at the separation area SA. Hereinafter, a difference in the inspection result according to kinds of defects will described with reference to FIGS. 6A, 6B, 7A, 7B, 8A, and 8B. In FIGS. 6B, 7B, and 8B, the line PDD represents a change in the light amount signal of the reflection light RL measured by the light-receiving part 360, the line I1 represents a change in the near-field ultrasound signal measured by the first interferometer 370, and the line I2 represents a change in the guided wave signal measured by the second interferometer 380.

Figure 6A:
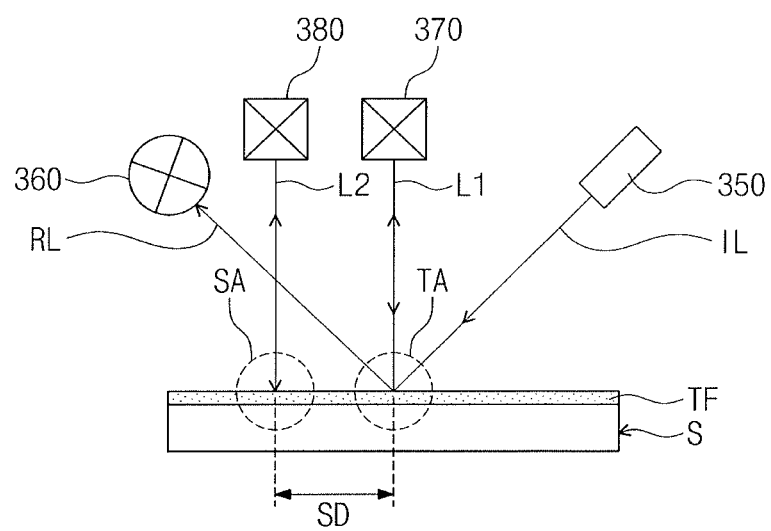
FIG. 6A illustrates a schematic diagram of an inspection process, when there is no defect in a target area.
Figure 6B:
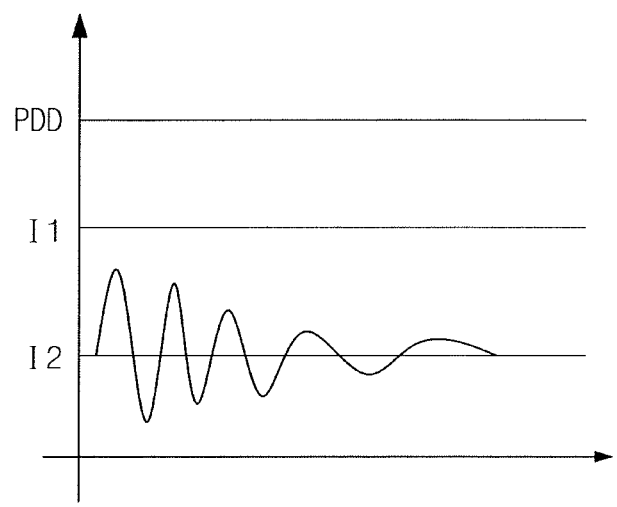
FIG. 6B illustrates a graph showing data measured by a first interferometer, a second interferometer, and a light-receiving part, when there is no defect in a target area.

FIG. 6A is a diagram schematically illustrating an inspection process, when there is no defect in the target area TA. FIG. 6B is a graph showing data measured by the first interferometer 370, the second interferometer 380, and the light-receiving part 360, when there is no defect in the target area TA.

Referring to FIGS. 6A and 6B, when there was no defect in or on the target area TA, there was no change in the light amount signal PDD of the reflected light. Similarly, since there was no occurrence or change in the near-field ultrasound of the target area TA, there was no change in the near-field ultrasound signal I1. Here, the guided wave signal I2 obtained from the separation area SA may be used to obtain information on physical properties (e.g., a density, a modulus of elasticity, and so forth) of the thin film TF.

Figure 7A:
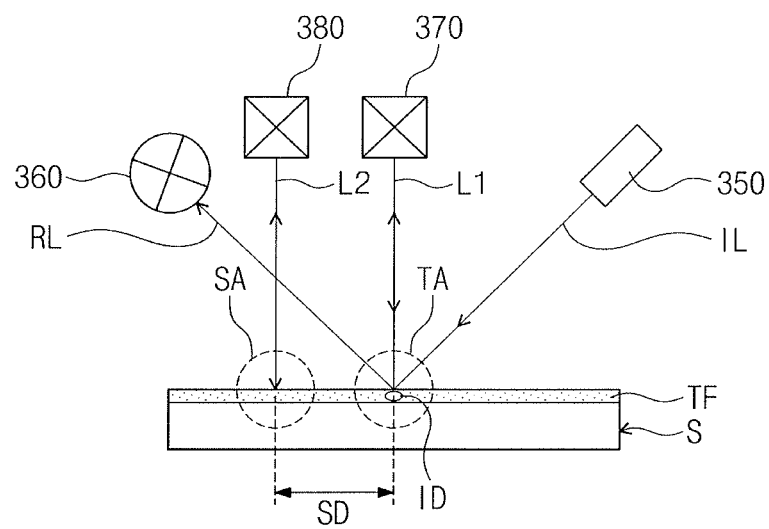
FIG. 7A illustrates a schematic diagram of an inspection process, when there is a defect below or in a thin film of a target area.
Figure 7B:
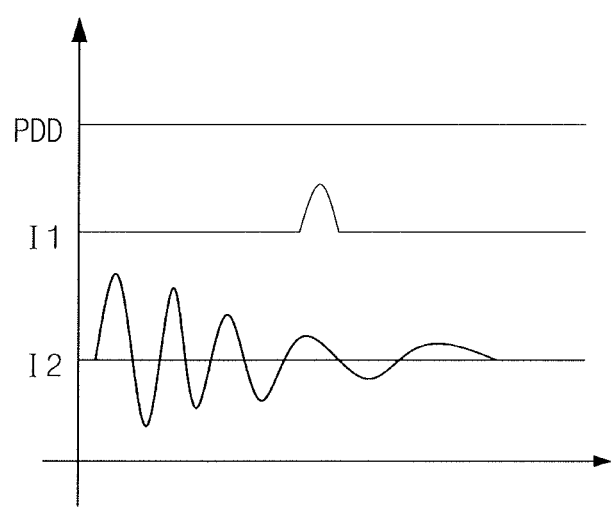
FIG. 7B illustrates a graph showing data measured by a first interferometer, a second interferometer, and a light-receiving part, when there is a defect below a thin film of a target area.

FIG. 7A is a diagram schematically illustrating an inspection process, when there is a defect ID below or in the thin film TF of the target area TA, i.e., the defect ID is below an uppermost surface of the thin film TF that faces the first and second interferometers. FIG. 7B is a graph showing data measured by the first interferometer 370, the second interferometer 380, and the light-receiving part 360, when there is the defect ID below the thin film TF of the target area TA.

Referring to FIGS. 7A and 7B, when there was a defect ID below or in the thin film TF of the target area TA, there was no change in light amount signal PDD of the reflection light. Since the light amount signal PDD of the reflection light is dependent on a surface reflectance of the target area TA, the defect ID below or in the thin film TF of the target area TA may not affect the light amount signal PDD of the reflection light. However, the presence of the defect ID may lead to a change of the near-field ultrasound below or in the thin film TF, and thus, a change in the near-field ultrasound signal I1 may be sensed. Here, the guided wave signal I2 obtained from the separation area SA may be used to obtain information on physical properties (e.g., a density, a modulus of elasticity, and so forth) of the thin film TF.

Figure 8A:
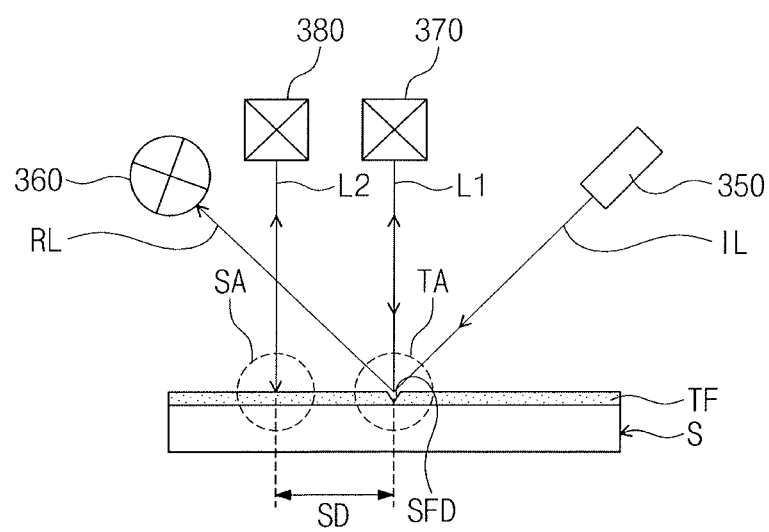
FIG. 8A illustrates a schematic diagram of an inspection process, when there is a defect on a substrate surface of a target area (e.g., a surface of a thin film).
Figure 8B:
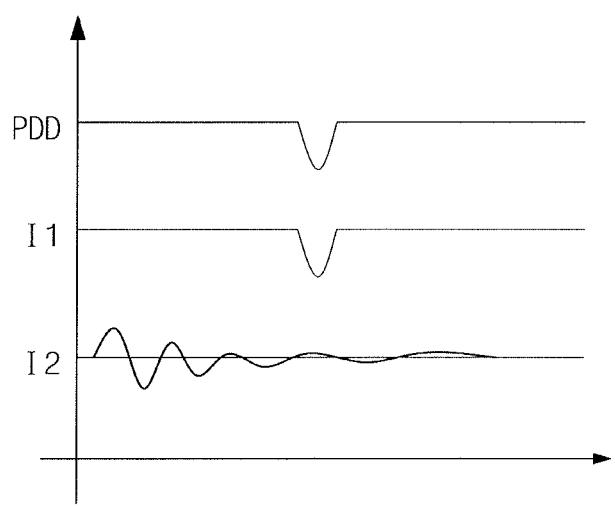
FIG. 8B illustrates a graph showing data measured by a first interferometer, a second interferometer, and a light-receiving part, when there is a defect on a substrate surface of a target area (e.g., a surface of a thin film).

FIG. 8A is a diagram schematically illustrating an inspection process, when there is a defect SFD on a surface of the substrate S of the target area TA, i.e., the defect SFD is in an uppermost surface of the thin film TF that faces the first and second interferometers. FIG. 8B is a graph showing data measured by the first interferometer 370, the second interferometer 380, and the light-receiving part 360, when there is the defect SFD on a surface of the substrate S of the target area TA.

Referring to FIGS. 8A and 8B, when there is a defect SFD on the surface of the thin film TF of the target area TA, there was a change in the light amount signal PDD of the reflection light. The defect SFD on the surface of the thin film TF may be regarded as a defect in the thin film TF. In addition, the presence of the defect SFD may lead to a change of the near-field ultrasound on and/or below the surface of the thin film TF, and thus, the change of the near-field ultrasound signal I1 may be sensed. Here, the guided wave signal I2 obtained from the separation area SA may not be used to obtain information on the physical properties (e.g., density and/or modulus of elasticity, and so forth) of the thin film TF.

Operations of the optical inspection apparatus 30 and the controller 40 described above may be performed by at least one controller via code or instructions to be executed by a computer, processor, manager, or controller. The computer, processor, controller, or other signal processing device may be those described herein or one in addition to the elements described herein. Any convenient algorithms that form the basis of the operations of the computer, processor, or controller may be used, and the code or instructions for implementing the operations of the embodiments may transform the computer, processor, controller, or other signal processing device into a special-purpose processor for performing the methods described herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, or controller which is to execute the code or instructions for performing the method embodiments described herein.

As described above, by comparing the change in light amount signal of the reflection light with the change in the near-field ultrasound signal, it may be possible to obtain information on the presence or absence, as well as position, of a defect. In addition, from the change of the near-field ultrasound, it may be possible to detect defects of several micrometers. Thus, it may be possible to provide an optical inspection apparatus with improved inspection reliability, a substrate inspection method using the same, and a method of fabricating a semiconductor device using the same.

Figure 9:
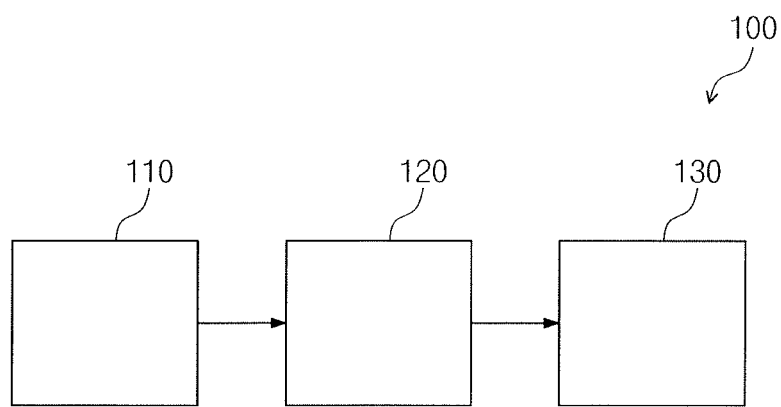
FIG. 9 illustrates a block diagram of a fabrication system of a semiconductor device according to an embodiment.

FIG. 9 illustrates a fabrication system 100 of a semiconductor device according to an embodiment.

Referring to FIG. 9, the fabrication system 100 may include a first processing apparatus 110, an inspection apparatus 120, and a second processing apparatus 130. As an example, the first processing apparatus 110 may be a thin film deposition apparatus. For example, the first processing apparatus 110 may include a chemical vapor deposition apparatus or a physical vapor deposition apparatus.

Figure 10:
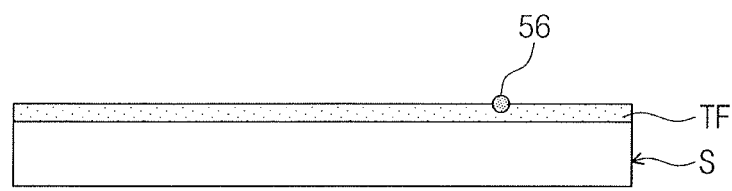
FIG. 10 illustrates a sectional view of a thin film, which is formed on a substrate by a first processing apparatus of FIG. 9.

FIG. 10 illustrates an example of the thin film TF formed on the substrate S by the first processing apparatus 110 of FIG. 9.

Referring to FIG. 10, the first processing apparatus 110 may be configured to form the thin film TF on the substrate S. The substrate S may include a silicon wafer. The thin film TF may include a poly silicon layer, a metal layer, or a dielectric layer, which is formed by a chemical vapor deposition method or a physical vapor deposition method, but embodiments are not limited to this example.

Referring to FIGS. 9 and 10, the inspection apparatus 120 may be disposed between the first processing apparatus 110 and the second processing apparatus 130. The inspection apparatus 120 may be configured to inspect the substrate S and the thin film TF. For example, the inspection apparatus 120 may be configured to inspect whether there is a defect 56 on the substrate S and the thin film TF and to examine material characteristics of the substrate S and the thin film TF.

The second processing apparatus 130 may be configured to perform a fabrication process on the substrate S or the thin film TF. For example, the second processing apparatus 130 may include a spinner apparatus, an exposure apparatus, an etching apparatus, or a chemical mechanical polishing apparatus. In an embodiment, the second processing apparatus 130 may be configured to perform a patterning process on the substrate S or the thin film TF. In certain embodiments, the second processing apparatus 130 may be configured to polish the substrate S or the thin film TF.

Figure 11:
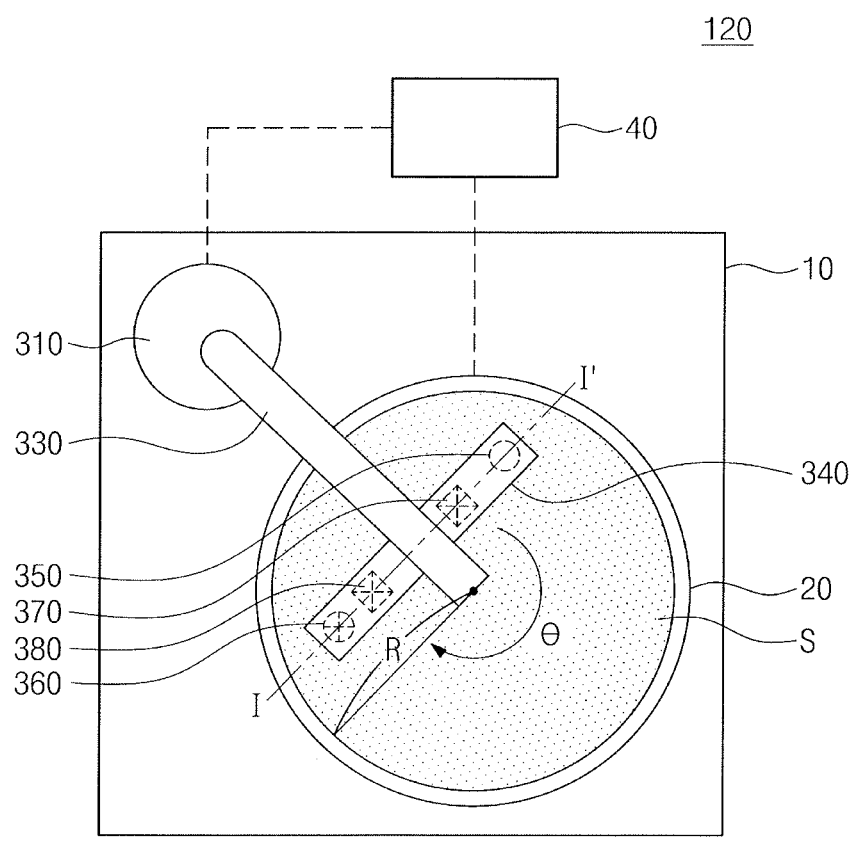
FIG. 11 illustrates a plan view of an example of an inspection apparatus of FIG. 9.
Figure 12:
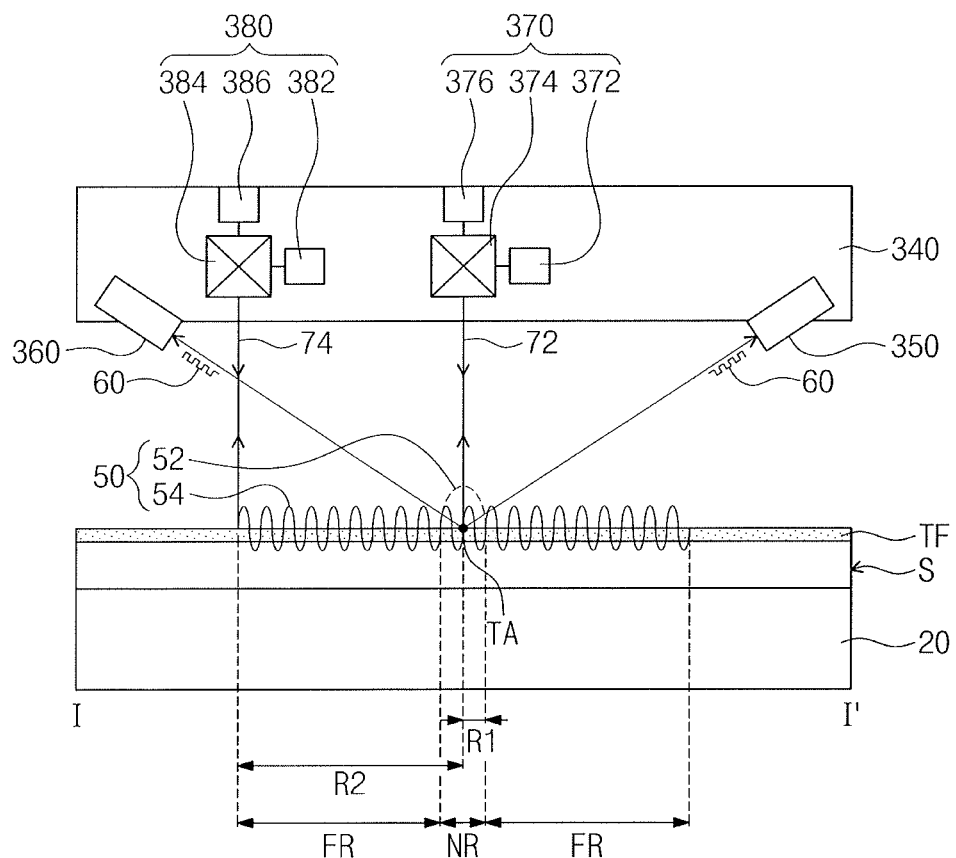
FIG. 12 illustrates a sectional view taken along a line I-I' of FIG. 11.

FIG. 11 illustrates an example of the inspection apparatus 120 of FIG. 9. FIG. 12 illustrates a sectional view taken along a line I-I' of FIG. 11.

Referring to FIGS. 11 and 12, the inspection apparatus 120 may be an ultrasound inspection apparatus or a photoacoustic measurement apparatus. As an example, the inspection apparatus 120 may include the process chamber 10, the stage 20, the controller 40, the driver 310, the supporting arm 330, the body 340, the light source 350, the light-receiving part 360, the first interferometer 370, and the second interferometer 380.

The process chamber 10 may be a housing structure enclosing the stage 20, the driver 310, the supporting arm 330, the body 340, the light source 350, the light-receiving part 360, the first interferometer 370, and the second interferometer 380. The process chamber 10 may be configured to prevent an external light from entering an internal space thereof. and thus, it may be possible to prevent or suppress a noise issue from occurring in detection signals of the light-receiving part 360, the first interferometer 370, and the second interferometer 380.

The stage 20 may be provided in a lower portion of the process chamber 10. The stage 20 may be configured to load the substrate S. The stage 20 may also be configured to rotate the substrate S in an azimuthal direction θ.

The driver 310 may be disposed near the stage 20 and in the process chamber 10. The driver 310 may support the supporting arm 330. The driver 310 may be configured to rotate the supporting arm 330 and thereby to move the body 340, the light source 350, the light-receiving part 360, the first interferometer 370, and the second interferometer 380 in a radial direction R of the substrate S.

The supporting arm 330 may be provided between and connected to the driver 310 and the body 340. The supporting arm 330 may be shrunken/expanded and/or folded/unfolded to move the body 340 from a center of the substrate S to an edge of the substrate S. In certain embodiments, the supporting arm 330 may have a rail, which is used to move the body 340.

The body 340 may be disposed at an end portion of the supporting arm 330 that is opposite to the driver 310. The body 340 may be extended in a direction crossing the supporting arm 330. The supporting arm 330 and the body 340 may form a cross shape. For example, the supporting arm 330 may be extended in a first direction x, and the body 340 may be extended in a second direction y. The light source 350, the light-receiving part 360, the first interferometer 370, and the second interferometer 380 may be arranged in the body 340 in the second direction y.

The light source 350 may be disposed in a side portion of the body 340. As an example, the light source 350 may include a pulse laser. The light source 350 may be configured to irradiate a pulsed beam 60 onto the target area TA of the thin film TF. The pulsed beam 60 may include a single pulse laser beam or a burst pulse laser beam. A portion of the pulsed beam 60 may be reflected from the target area TA of the thin film TF.

The light-receiving part 360 may be disposed in an opposite side portion of the body 340. The light-receiving part 360 may be configured to receive the reflected portion of the pulsed beam 60 and to detect a pulse signal 64 (e.g., see FIG. 16) of the target area TA. The controller 40 may be configured to examine whether there is a surface defect 57 (e.g., see FIG. 21) on the thin film TF, from a pulse peak 62 of the pulse signal 64.

In an embodiment, a portion of the pulsed beam 60 may be absorbed by the target area TA of the thin film TF to produce an ultrasound 50 and/or a photoacoustic wave. As an example, the ultrasound 50 may include a near field ultrasound 52 and a far field ultrasound 54. The near field ultrasound 52 and the far field ultrasound 54 may be measured in a near field region NR and a far field region FR, respectively.

Figure 13:
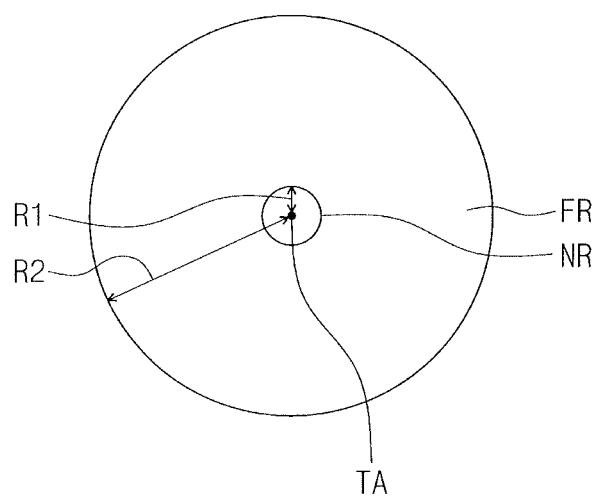
FIG. 13 illustrates a plan view of an example of a near field region and a far field region of FIG. 12.

FIG. 13 illustrates an example of the near field region NR and the far field region FR of FIG. 12.

Referring to FIG. 13, the near field region NR may be disposed in the far field region FR. The near field region NR may include the target area TA. The target area TA may be located at a common center of both of the near and far field regions NR and FR. For example, the near field region NR may have a circular shape, and the far field region FR may have a circular ring shape.

Referring back to FIG. 12, the near field ultrasound 52 may be produced in the near field region NR by the pulsed beam 60 irradiated onto the target area TA. The near field ultrasound 52 may not have a full waveform (e.g., a sinusoidal waveform). For example, the near field ultrasound 52 may have a shape of a single peak.

The far field ultrasound 54 may be produced by the near field ultrasound 52. The far field ultrasound 54 may be a guided wave, which is produced when the near field ultrasound 52 propagates along a top surface of the thin film TF. The far field ultrasound 54 may propagate from the near field region NR to the far field region FR. The far field ultrasound 54 may have a wavelength ranging from about 1 μm to about 10 mm. As an example, the near field region NR may have a first radius R1, which corresponds to a wavelength of the far field ultrasound 54. For example, the first radius R1 may range from about 1 μm to about 10 mm. The far field region FR may have an inner radius, which is determined by the first radius R1. The far field region FR may have an outer radius, which is determined by a second radius R2 (e.g., about 10 times the wavelength of the far field ultrasound 54).

The second radius R2 may be about 10 cm. In other words, the far field region FR may have an inner radius of about 1 μm and an outer radius of about 10 cm. An intensity of the far field ultrasound 54 may be attenuated and/or degraded with increasing distance from the target area TA. In the case where the propagation distance of the far field ultrasound 54 becomes larger than 10 times its wavelength, the intensity of the far field ultrasound 54 may be rapidly weakened.

The first interferometer 370 may be disposed between the light source 350 and the light-receiving part 360. In addition, the first interferometer 370 may be disposed on the near field region NR. The first interferometer 370 may measure the near field ultrasound 52 by providing a first continuous wave beam 72 to the near field region NR. The first continuous wave (CW) beam 72 may be an electromagnetic wave having a uniform intensity and a specific frequency. For example, the first CW beam 72 may include a CW laser beam. The first interferometer 370 may obtain a first continuous signal 84 (e.g., see FIG. 17) by measuring the near field ultrasound 52 in the near field region NR. The controller 40 may obtain information on defects of the substrate S, based on a CW peak 82 (e.g., see FIG. 17) of the first continuous signal 84. As an example, the first interferometer 370 may include a first laser 372, a first optical system 374, and a first light sensor 376. The first laser 372 may provide the first CW beam 72 to the first optical system 374. The first optical system 374 may be disposed on the near field region NR. The first optical system 374 may provide the first CW beam 72 to the near field region NR and may transfer a portion of the first CW beam 72, which is reflected from the near field region NR, to the first light sensor 376. The first light sensor 376 may receive the reflected portion of the first CW beam 72 and may produce the first continuous signal 84 for the near field ultrasound 52.

The second interferometer 380 may be disposed between the first interferometer 370 and the light-receiving part 360. In certain embodiments, the second interferometer 380 may be disposed between the first interferometer 370 and the light source 350. The second interferometer 380 may be disposed on the far field region FR. The second interferometer 380 may measure the far field ultrasound 54 by providing the second CW beam 74 to the far field region FR. The second CW beam 74 may be the same as the first CW beam 72. The second interferometer 380 may obtain a second continuous signal 86 (e.g., see FIG. 18) by measuring the far field ultrasound 54 in the far field region FR. The controller 40 may examine material characteristics of the substrate S by comparing the second continuous signal 86 with reference signals. As an example, the second interferometer 380 may include a second laser 382, a second optical system 384, and a second light sensor 386. The second laser 382 may provide the second CW beam 74 to the second optical system 384. The second optical system 384 may be disposed on the far field region FR. The second optical system 384 may provide the second CW beam 74 to the far field region FR, may receive a portion of the second CW beam 74, which is reflected from the far field region FR, and may produce the second continuous signal 86 for the far field ultrasound 54.

Hereinafter, a method of fabricating a semiconductor device using the fabrication system 100 described above will be described below.

Figure 14:
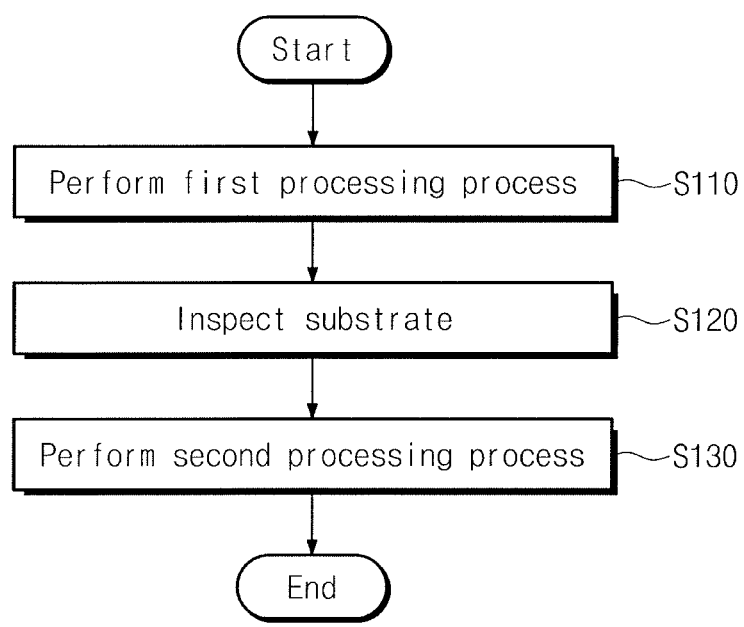
FIG. 14 illustrates a flow chart of a method of fabricating a semiconductor device, according to an embodiment.

FIG. 14 illustrates a method of fabricating a semiconductor device, according to an embodiment.

Referring to FIGS. 9, 10, and 14, the first processing apparatus 110 may perform a first processing process on the substrate S (in S110). As an example, the first processing process on the substrate S (in S110) may include forming a thin film TF on the substrate S. The thin film TF may be formed on the substrate S by a chemical vapor deposition method or a physical vapor deposition method. For example, the thin film TF may include a silicon oxide layer, a silicon nitride layer, a metal oxide layer, or a metal nitride layer. In certain embodiments, the thin film TF may be formed by a spin coating method or a sol-gel method. The thin film TF may include an organic thin film, but embodiments are not limited to this example.

Referring to FIGS. 11 and 14, the inspection apparatus 120 may inspect the substrate S (in S120). As an example, the step S120 of inspecting the substrate S may include inspecting the thin film TF on the substrate S. The thin film TF may be inspected by an optical inspection method and/or a photoacoustic inspection method. For example, the inspection apparatus 120 may measure the near field ultrasound 52 and the far field ultrasound 54, which are produced by the pulsed beam 60, using the first CW beam 72 and the second CW beam 74 to inspect the defect 56 of the thin film TF as well as material characteristics of the thin film TF.

Figure 15:
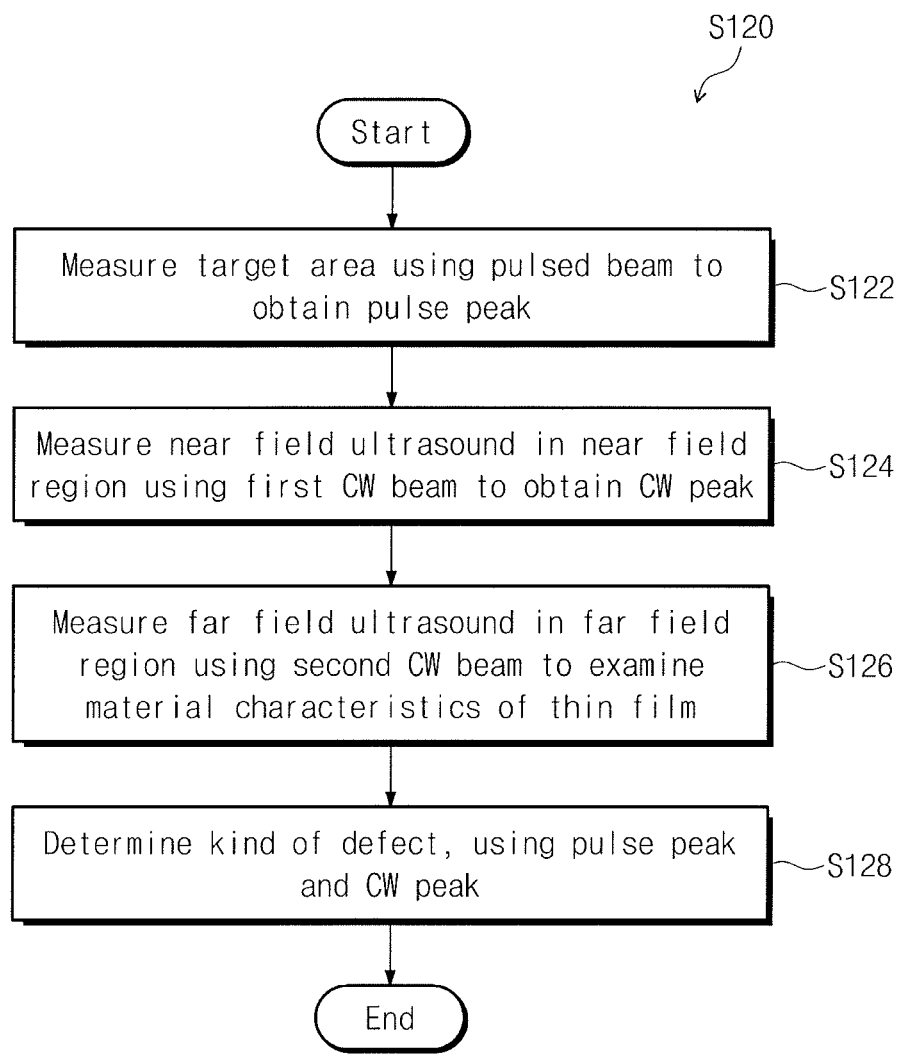
FIG. 15 illustrates a flow chart of a step of inspecting a substrate of FIG. 10.
Figure 16:
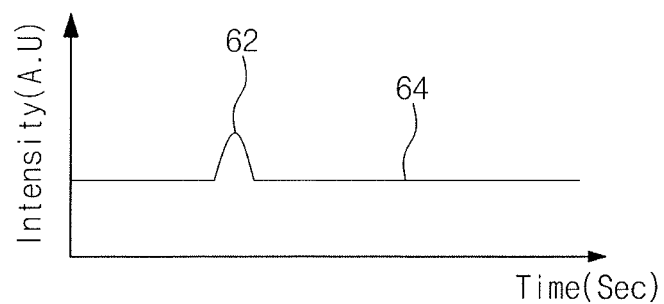
FIG. 16 illustrates a graph showing an example of a pulse peak detected by a light-receiving part of FIG. 11.

FIG. 15 illustrates an example of a step S120 of inspecting the substrate S of FIG. 10. FIG. 16 illustrates an example of the pulse peak 62 detected by the light-receiving part 360 of FIG. 11.

Referring to FIGS. 15 and 16, the light source 350 and the light-receiving part 360 may obtain the pulse peak 62 by measuring the target area TA using the pulsed beam 60 (in S122). The light source 350 may irradiate the pulsed beam 60 onto the target area TA. The light-receiving part 360 may receive the pulsed beam 60 reflected from the target area TA and may produce the pulse signal 64 therefrom. The pulse signal 64 may include the pulse peak 62. The pulse peak 62 may be a detection signal, which contains information on the surface defect 57 (e.g., see FIG. 21) of the thin film TF. If the pulsed beam 60 is incident into the target area TA, the near field ultrasound 52 and the far field ultrasound 54 may be produced in the near field region NR and the far field region FR, respectively. The far field ultrasound 54 may have a wavelength ranging from about 1 μm to about 10 mm. The near field region NR may have the first radius R1, which corresponds to a wavelength of the far field ultrasound 54. For example, the first radius R1 may range from about 1 μm to about 10 mm. The far field region FR may have an inner radius, which is determined by the first radius R1. The far field region FR may have an outer radius, which is determined by a second radius R2 (e.g., about 10 times the wavelength of the far field ultrasound 54). The second radius R2 may be about 10 cm. The far field region FR may have an inner radius ranging from about 1 μm to about 10 mm and an outer radius of about 10 cm.

Figure 17:
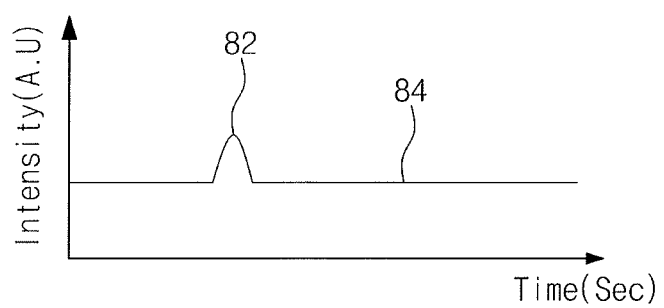
FIG. 17 illustrates a graph showing an example of a continuous wave (CW) peak detected by a first interferometer of FIG. 11.

FIG. 17 illustrates an example of the CW peak 82 detected by the first interferometer 370 of FIG. 11.

Referring to FIGS. 15 and 17, the first interferometer 370 may obtain the CW peak 82 by measuring the near field ultrasound 52 in the near field region NR using the first CW beam 72 (in S124). The first laser 372 may provide the first CW beam 72 to the near field region NR, and the first light sensor 376 may receive the first CW beam 72, which is reflected from the near field region NR, and then may produce the first continuous signal 84 from the first CW beam 72. The first continuous signal 84 may include the CW peak 82. The CW peak 82 may be a detection signal, which contains information on the surface defect 57 (e.g., see FIG. 21) and an internal defect 58 (e.g., see FIG. 23) of the thin film TF.

Figure 18:
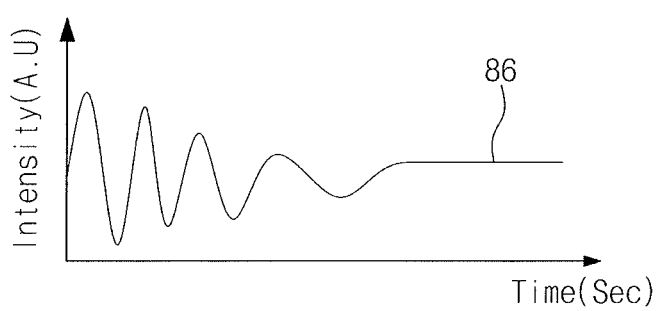
FIG. 18 illustrates a graph showing an example of a second continuous signal detected by a second interferometer of FIG. 11.

FIG. 18 illustrates an example of the second continuous signal 86 detected by the second interferometer 380 of FIG. 11.

Referring to FIGS. 15 and 18, the second interferometer 380 may measure the far field ultrasound 54 in the far field region FR using the second CW beam 74 to examine material characteristics of the thin film TF (in S126).

Figure 19:
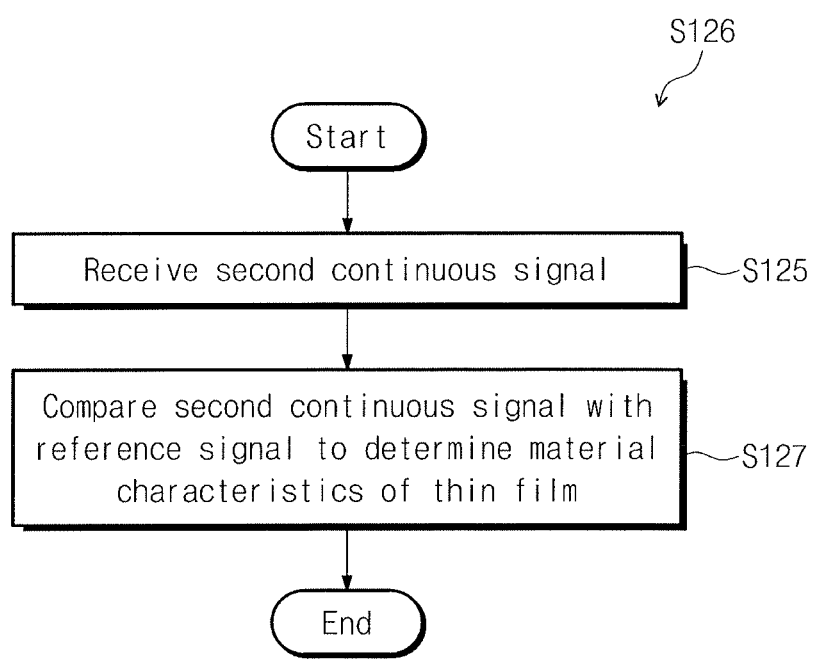
FIG. 19 illustrates a flow chart of a step of measuring a far field ultrasound in a far field region using a second CW beam of FIG. 11 to examine material characteristics of a thin film.

FIG. 19 illustrates an example of a step S126 of measuring the far field ultrasound 54 in the far field region FR using the second CW beam 74 of FIG. 11 to examine material characteristics of the thin film TF.

Referring to FIG. 19, the controller 40 may receive the second continuous signal 86 from the second interferometer 380 (in S125).

Thereafter, the controller 40 may compare the second continuous signal 86 with reference signals (not shown) to obtain information on material characteristics of the thin film IF (in S127). In the case where the second continuous signal 86 is the same as one of the reference signals, the controller 40 may determine that the thin film TF has material characteristics associated with the reference signal, which is determined to be the same as the second continuous signal 86. The material characteristics may include, for example, density, surface roughness, refractive index, resistivity, and conductivity of the thin film TF, but embodiments are not limited to these examples.

Referring back to FIG. 15, the controller 40 may determine a kind of the defect 56, using the pulse peak 62 and the CW peak 82 (in S128).

Figure 20:
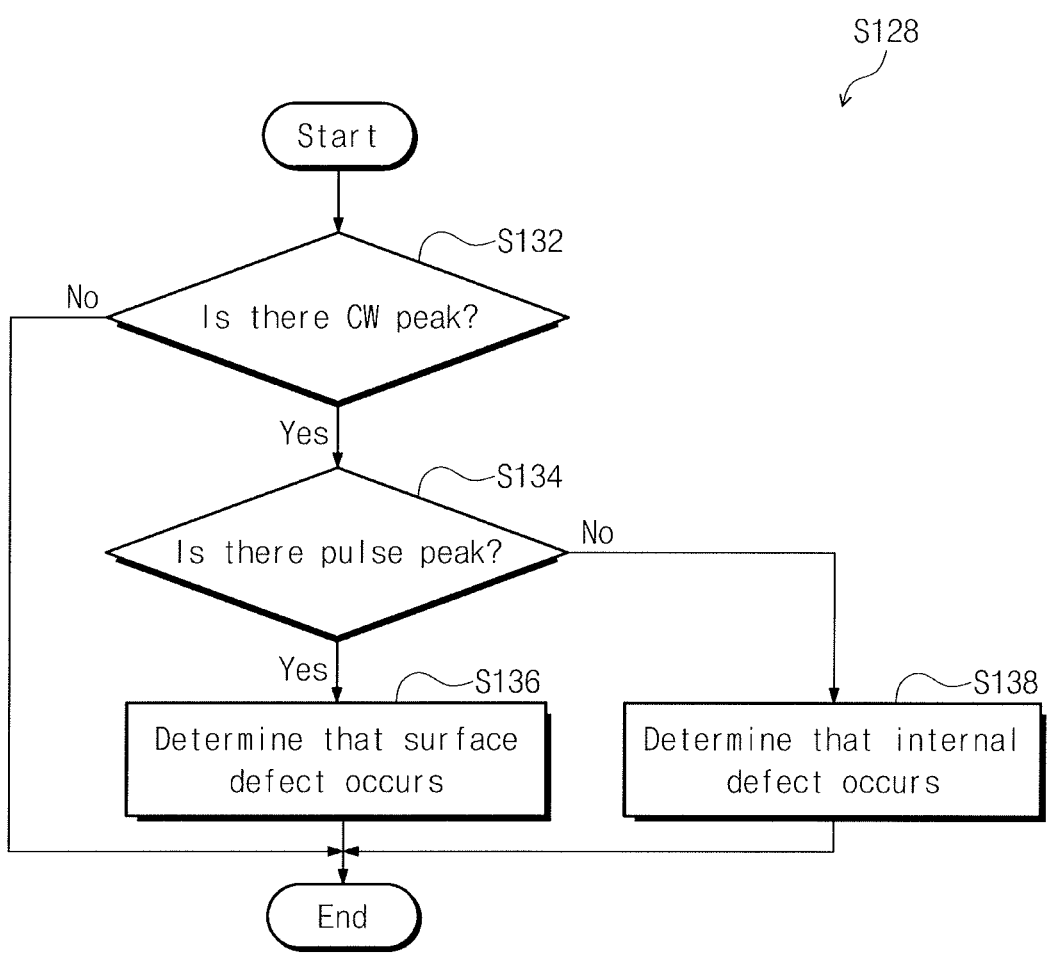
FIG. 20 illustrates a flow chart of a step of determining a kind of a defect using a pulse peak of FIG. 16 and a CW peak of FIG. 17.

FIG. 20 illustrates an example of the step S128 of determining a kind of the defect 56 using the pulse peak 62 of FIG. 16 and the CW peak 82 of FIG. 17.

Referring to FIG. 20, the controller 40 may examine whether there is the CW peak 82 (in S132). If there is no CW peak 82, the controller 40 may determine that there is no defect 56 in the target area TA. The thin film TF may be evaluated to be normally formed without any defect 56. If there is the CW peak 82, the controller 40 may determine that the defect 56 occurs on the thin film TF in the target area TA.

If the CW peak 82 is evaluated to be present, the controller 40 may determine whether there is the pulse peak 62 or not (in S134).

Figure 21:
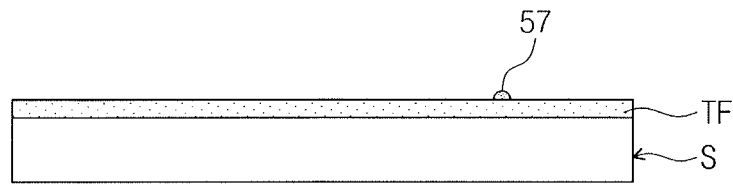
FIGS. 21 and 22 illustrate sectional views of some examples of a surface defect determined by a controller of FIG. 11.
Figure 22:
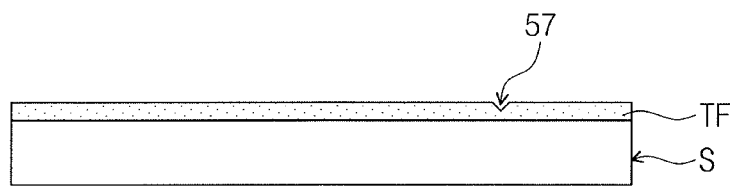

FIGS. 21 and 22 illustrate some examples of the surface defect 57 determined by the controller 40 of FIG. 11.

Referring to FIGS. 20 to 22, when there is the pulse peak 62, the controller 40 may determine that the surface defect 57 occurs on the thin film TF and in the target area TA (in S136). In this case, information on the surface defect 57 may be displayed on a display device (not shown). The surface defect 57 may include, for example, a particle (e.g., see FIG. 21) or a groove (e.g., see FIG. 22).

Figure 23:
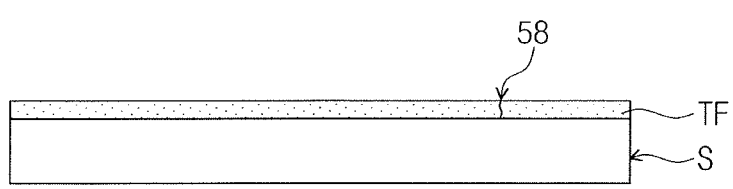
FIGS. 23 and 24 illustrate sectional views of some examples of an internal defect determined by a control unit of FIG. 11.
Figure 24:
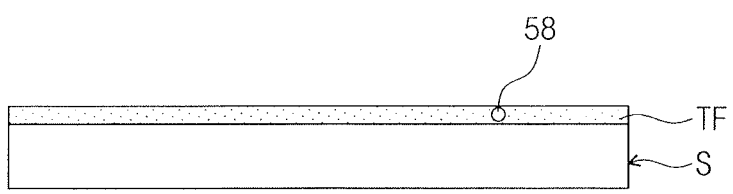

FIGS. 23 and 24 illustrate some examples of the internal defect 58 determined by the controller 40 of FIG. 11.

Referring to FIGS. 20, 23, and 24, when there is the pulse peak 62, the controller 40 may determine that the internal defect 58 occurs in the target area TA (in S138). The internal defect 58 may include, for example, a crack (e.g., see FIG. 23) or a void (e.g., see FIG. 24) formed in the thin film TF.

The types of the defect 24 according to the pulse peak 62 and the CW peak 82 are summarized in the following table 1.

TABLE 1

|  | Case I (No defect) | Case II (Internal defect) | Case III (Surface defect) |
| --- | --- | --- | --- |
| Pulse peak | X | X | ○ |
| CW peak | X | ○ | ○ |

In Case I, there is neither the pulse peak 62 nor the CW peak 82. In this case, the thin film TF may not have both of the surface defect 57 and internal defect 58.

In Case II, there is only the CW peak 82, without the pulse peak 62. In this case, the thin film TF may have the internal defect 58.

In Case III, there are not only the pulse peak 62 but also the CW peak 82. In this case, the thin film TF may have the surface defect 57.

Although not shown, the stage 20 may be configured to rotate the substrate S and thereby to move the target area TA in the azimuth direction θ. The driver 310 and the supporting arm 330 may be configured to move the light source 350, the light-receiving part 360, the first interferometer 370, and the second interferometer 380 of the body 340 in the radial direction R of the substrate S. Thus, the target area TA may be moved in the azimuth and radial directions θ and R of the substrate S. The inspection apparatus 120 may scan the thin film TF to obtain a mapping information on the surface defect 57 and the internal defect 58, which may be formed on the substrate S.

Referring back to FIG. 14, the second processing apparatus 130 may perform a second processing process on the substrate S (in S130). As an example, the second processing process (in S130) may include patterning the thin film TF. In certain embodiments, the second processing process (S130) may include polishing the thin film TF.

An inspection method according to an embodiment may include measuring a near field ultrasound and a far field ultrasound, which are produced by a pulsed beam, using a plurality of continuous wave (CW) beams. This may make it possible to examine whether there are defects on a thin film and to examine material characteristics of the thin film.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A substrate inspection method, comprising:
measuring a target area of a substrate using a pulsed beam to obtain a first peak containing information on a surface defect of the substrate;
measuring a near field ultrasound, which is produced by the pulsed beam in a near field region including the target area, using a first continuous wave beam different from the pulsed beam to obtain a second peak containing information on an internal defect in the substrate or the surface defect; and measuring a far field ultrasound, which is produced by the near field ultrasound in a far field region outside the near field region, using a second continuous wave beam to examine material characteristics of the substrate.

2. The method as claimed in claim 1, further comprising determining a kind of the surface defect formed on the substrate using the first peak and the second peak.

3. The method as claimed in claim 2, wherein determining the kind of the surface defect on the substrate using the first peak and the second peak includes:
determining whether the second peak is obtained;
determining whether the first peak is obtained, when the second peak is obtained; and
determining that the surface defect occurs in the target area, when the first peak is obtained.

4. The method as claimed in claim 3, wherein the surface defect includes a particle defect or a groove defect.

5. The method as claimed in claim 3, wherein determining the kind of the surface defect on the substrate using the first peak and the second peak further includes determining that the internal defect occurs in the target area, when the first peak is absent.

6. The method as claimed in claim 5, wherein the internal defect includes a crack or a void.

7. The method as claimed in claim 1, wherein the near field region has a radius corresponding to a wavelength of the far field ultrasound.

8. The method as claimed in claim 7, wherein the far field region has an inner radius that is equal to the wavelength of the far field ultrasound.

9. The method as claimed in claim 7, wherein the far field region has an outer radius that is 10 times the wavelength of the far field ultrasound.

10. The method as claimed in claim 1, wherein measuring the far field ultrasound in the far field region using the second continuous wave beam includes:
receiving a continuous signal of the second continuous wave beam; and
comparing the continuous signal with reference signals to determine the material characteristics of the thin film.

11. A substrate inspection method, comprising:
measuring a target area on a substrate using a pulsed beam to obtain a first peak;
measuring a near field ultrasound, which is produced by the pulsed beam in a near field region including the target area, using a first continuous wave beam different from the pulsed beam to obtain a second peak; and
determining a kind of a defect, which is formed on the substrate, using the first peak and the second peak,
wherein determining the kind of the defect formed on the substrate using the first peak and the second peak includes:
determining whether the second peak is obtained,
determining whether the first peak is obtained, when the second peak is obtained,
determining that a surface defect occurs in the target area, when the first peak is obtained, and
determining that an internal defect occurs in the target area, when the first peak is absent.

12. The method as claimed in claim 11, further comprising measuring a far field ultrasound, which is produced in a far field region outside the near field region, using a second continuous wave beam to examine material characteristics of the substrate.

13. The method as claimed in claim 12, wherein the near field region has a first radius corresponding to a wavelength of the far field ultrasound.

14. The method as claimed in claim 13, wherein the far field region has an inner radius corresponding to the wavelength of the far field ultrasound and has an outer radius corresponding to ten times the wavelength of the far field ultrasound.

15. The method as claimed in claim 14, wherein the inner radius of the far field region ranges from 1 μm to 10 mm, and the outer radius of the far field region is about 10 cm.

16. A method of fabricating a semiconductor device, comprising:
performing a first processing process on a substrate; and
inspecting the substrate, wherein inspecting the substrate includes:
measuring a target area of the substrate using a pulsed beam to obtain a first peak containing information on a surface defect of the substrate, and
measuring a near field ultrasound, which is produced by the pulsed beam in a near field region including the target area, using a first continuous wave beam different from the pulsed beam to obtain a second peak containing information on an internal defect in the substrate or the surface defect.

17. The method as claimed in claim 16, wherein the first processing process include forming a thin film on the substrate, and inspecting the substrate further includes inspecting the thin film on the substrate.

18. The method as claimed in claim 17, further comprising measuring a far field ultrasound, which is produced by the near field ultrasound in a far field region outside the near field region, using a second continuous wave beam to examine material characteristics of the thin film.

19. The method as claimed in claim 18, further comprising performing a second processing process on the substrate, wherein the second processing process includes patterning the thin film.

20. The method as claimed in claim 19, wherein the second processing process includes polishing the thin film.

* * * * *